United States Patent
Gamborg et al.

(10) Patent No.: US 9,312,201 B2
(45) Date of Patent: Apr. 12, 2016

(54) HEAT DISSIPATION DEVICE

(75) Inventors: Gorm Gamborg, Kolding (DK);
Kristian Silberbauer, Ribe (DK);
Carsten Nommensen Tingskov,
Fredericia (DK)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 1152 days.

(21) Appl. No.: 12/981,828

(22) Filed: Dec. 30, 2010

(65) Prior Publication Data

US 2012/0168132 A1    Jul. 5, 2012

(51) Int. Cl.
*H05K 7/20* (2006.01)
*H01L 23/467* (2006.01)
*H01L 23/367* (2006.01)

(52) U.S. Cl.
CPC .......... *H01L 23/467* (2013.01); *H05K 7/20154* (2013.01); *H05K 7/20436* (2013.01); *H01L 23/3672* (2013.01); *H01L 2924/0002* (2013.01)

(58) Field of Classification Search
CPC .......... H05K 7/20154; H05K 7/20163; H05K 7/20436; H01L 23/367; H01L 23/467
USPC ................................. 165/80.3, 179
See application file for complete search history.

(56) References Cited

U.S. PATENT DOCUMENTS

| | | | |
|---|---|---|---|
| 2,474,809 A | | 7/1949 | Abbott |
| 2,745,895 A * | | 5/1956 | Lideen ............ 165/80.3 |
| 2,960,114 A * | | 11/1960 | Hinde ............ 165/179 |
| 3,160,132 A * | | 12/1964 | Mowatt ............ 165/185 |
| 3,578,075 A * | | 5/1971 | Winter ............ 165/179 |
| 3,893,161 A * | | 7/1975 | Pesak, Jr. ............ 165/80.3 |
| 4,012,769 A * | | 3/1977 | Edwards et al. ............ 165/80.3 |
| 4,041,524 A * | | 8/1977 | Trunk et al. ............ 165/80.3 |
| 4,190,098 A * | | 2/1980 | Hanlon ............ 165/80.3 |
| 4,674,005 A | | 6/1987 | Lacz |
| 4,851,965 A | | 7/1989 | Gabuzda et al. |
| 4,872,089 A | | 10/1989 | Ocken et al. |
| 4,899,255 A | | 2/1990 | Case et al. |
| 4,923,179 A | | 5/1990 | Mikolajczak |
| 5,077,638 A | | 12/1991 | Andersson et al. |
| 5,311,928 A * | | 5/1994 | Marton ............ 165/80.3 |
| 5,321,582 A | | 6/1994 | Casperson |
| 5,343,362 A | | 8/1994 | Solberg |
| 5,450,284 A | | 9/1995 | Wekell |
| 5,466,970 A | | 11/1995 | Smithers |
| 5,731,955 A | | 3/1998 | Bartanen et al. |
| 5,896,270 A | | 4/1999 | Tsui |
| 5,909,358 A | | 6/1999 | Bradt |

(Continued)

FOREIGN PATENT DOCUMENTS

EP    1628343 A2    2/2006

OTHER PUBLICATIONS

International Search Report for PCT/US2011/063722 mailed Apr. 12, 2012.

*Primary Examiner* — Leonard R Leo
(74) *Attorney, Agent, or Firm* — Lando & Anastasi, LLP

(57) ABSTRACT

A heat dissipation device for a heat-generating component includes at least one helically-shaped air tube having a length. The at least one air tube is thermally coupled to the heat-generating component to dissipate heat from the heat-generating component. Other embodiments of the heat dissipation device and methods for dissipating heat from a heat-generating component are further disclosed.

6 Claims, 4 Drawing Sheets

(56) References Cited

U.S. PATENT DOCUMENTS

| | | | |
|---|---|---|---|
| 5,946,188 A * | 8/1999 | Rochel et al. | 165/80.3 |
| 5,991,151 A | 11/1999 | Capriz | |
| 6,089,315 A * | 7/2000 | Lee et al. | 165/185 |
| 6,175,494 B1 * | 1/2001 | Komatsu | 165/80.3 |
| 6,208,517 B1 * | 3/2001 | Prince et al. | 165/80.3 |
| 6,422,303 B1 * | 7/2002 | Ishida et al. | 165/80.3 |
| 6,478,082 B1 * | 11/2002 | Li | 165/80.3 |
| 7,021,365 B2 | 4/2006 | Rearick et al. | |
| 7,148,452 B2 * | 12/2006 | Peterson et al. | 165/80.3 |
| 2002/0060064 A1 | 5/2002 | Yu | |
| 2003/0070790 A1 | 4/2003 | Chen et al. | |
| 2005/0225945 A1 | 10/2005 | Liu | |
| 2008/0186675 A1 | 8/2008 | Wang et al. | |
| 2009/0016020 A1 | 1/2009 | Wang et al. | |
| 2010/0290195 A1 | 11/2010 | Thomsen et al. | |

\* cited by examiner

HEAT DISSIPATION DEVICE

BACKGROUND OF THE INVENTION

1. Field of Invention

The present disclosure relates generally to the field of electronics and, more particularly, to devices and methods that dissipate heat from electronic components.

2. Discussion of Related Art

Modern electronic components produce excessive amounts of heat during operation. To ensure that the components do not overheat, system designers attach convective heat sinks to cool these components, by providing an efficient heat transfer path from the devices to the environment. A typical convective heat sink is designed to transfer heat energy from the high temperature component to lower temperature of the surrounding air. Such typical heat sinks attach to the components through a base and include fins or pins to increase the surface area of the heat sink within a given space.

FIG. 1 shows a well-known embodiment of a heat sink 100. The heat sink may be extruded from aluminum and comprises a heat dissipation component 102, having parallel fins 104 that extend perpendicularly from a base 106. By increasing the surface area of the heat sink 100, the heat transfer capacity of the heat sink 100 increases. The surface area of the heat sink 100 may be increased by extending the fins 104 in one direction away from the electronic component, thus creating an extruded fin profile, or by providing more, smaller fins. The air heated by the component 102 passes through the fins 104, thus transferring heat away from the device to the surrounding environment.

However, because the fins 104 are essentially flat plates, air flowing in the same direction along the surface of the plates forms a micro layer of stagnant air. This micro layer of air causes air flow to decrease near the surface of the fins, decreasing the overall air flow through the heat sink. This effect results in a decrease of the amount of heat dissipated from the electronic component that is transferred to the surrounding environment.

The efficiency of the heat sink design is measured by the thermal resistance between the heat sink and the ambient air. The micro layer of stagnant air causes decreases of air flow through the heat sink, thus increasing the thermal resistance of the heat sink and decreasing its efficiency. To compensate for the lower efficiency, designers are compelled to create larger and heavier heat sinks for electronic components that dissipate large amounts of heat. Although heat sinks vary in design, in general, the more surface area a heat sink has, the lower the thermal resistance. Particularly demanding cooling applications may require a number of heat sinks to be used concurrently, further increasing the volume and weight of the heat sink system. By increasing the volume, weight and the number of components of the heat sink, the cost increases due to increased material and more complex tooling. Large heat sinks may also be hard to implement in situations in which the space is constrained.

BRIEF SUMMARY OF THE INVENTION

Accordingly, there is a need for a more efficient and smaller system and method of heat dissipation that improves heat transfer from the electronic device to the surrounding environment. Aspects and embodiments of the present disclosure are directed to heat dissipation devices, systems and methods that decrease the weight and increase efficiency of the cooling solution.

One aspect of the disclosure is directed to a heat dissipation device for a heat-generating component. In one embodiment, the heat dissipation device comprises at least one helically-shaped air tube having a length. The at least one air tube is thermally coupled to the heat-generating component to dissipate heat from the heat-generating component.

Embodiments of the heat dissipation device further comprise a base plate coupled to the at least one helically-shaped air tube and the heat-generating component. The at least one helically-shaped air tube includes a wall configured to extend along the length of the air tube. The base plate is configured to be secured to the wall. The heat dissipation device further comprises at least one passage formed by the at least one helically-shaped air tube, the wall, and the base plate. Heat dissipated from the heat-generating component flows through a length of the at least one passage. The heat dissipation device further comprises at least two air tubes. Walls configured to extend along the length of the at least two air tubes form another air tube. The at least one helically-shaped air tube includes at least one channel formed in the air tube that extends lengthwise along the length of the air tube. The at least one channel is formed as a helix in the air tube. The at least one helically-shaped air tube includes an inlet provided on one end of the at least one air tube and an outlet provided on an opposite end of the at least one air tube, wherein heated air produced by the heat-generating component flows from the inlet to the outlet. The heat dissipation device further includes a fan configured to propel air from the inlet to the outlet. The at least one helically-shaped air tube includes an inner surface, wherein heated air produced by the heat-generating component flows along the inner surface to form a micro layer of air on the inner surface. The at least one helically-shaped air tube is configured to stir the micro layer of air flowing along the inner surface of the helically-shaped air tube. The heat dissipation device further comprises a housing configured to enclose the heat dissipation device.

Another aspect of the disclosure is directed to a method of dissipating heat from a heat-generating component. In one embodiment, the method comprises: providing at least one helically-shaped air tube having a length; coupling the at least one helically-shaped air tube to the heat-generating component; and dissipating heat from the heat-generating component with the at least one helically-shaped air tube.

Embodiments of the method further comprise coupling a base plate to the at least one helically-shaped air tube. The base plate is coupled to the heat-generating component. Dissipating heat from the heat-generating component further comprises stirring a micro layer of air formed on an inner surface of the at least one helically-shaped air tube. Providing at least one helically-shaped air tube includes providing at least one channel formed in the air tube that extends lengthwise along the length of the air tube. The at least one channel is formed as a helix in the air tube. Coupling the at least one helically-shaped air tube to the heat-generating component further includes forming a wall with the at least one helically-shaped air tube, and attaching the wall to the at least one helically-shaped air tube. The method further comprises forming at least one passage between the at least one helically-shaped air tube and the wall, and dissipating heat from the heat-generating component through a length of the at least one passage. The method further comprises moving heated air produced by heat-generating component with a fan.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

DETAILED DESCRIPTION OF THE INVENTION

Figure 1:
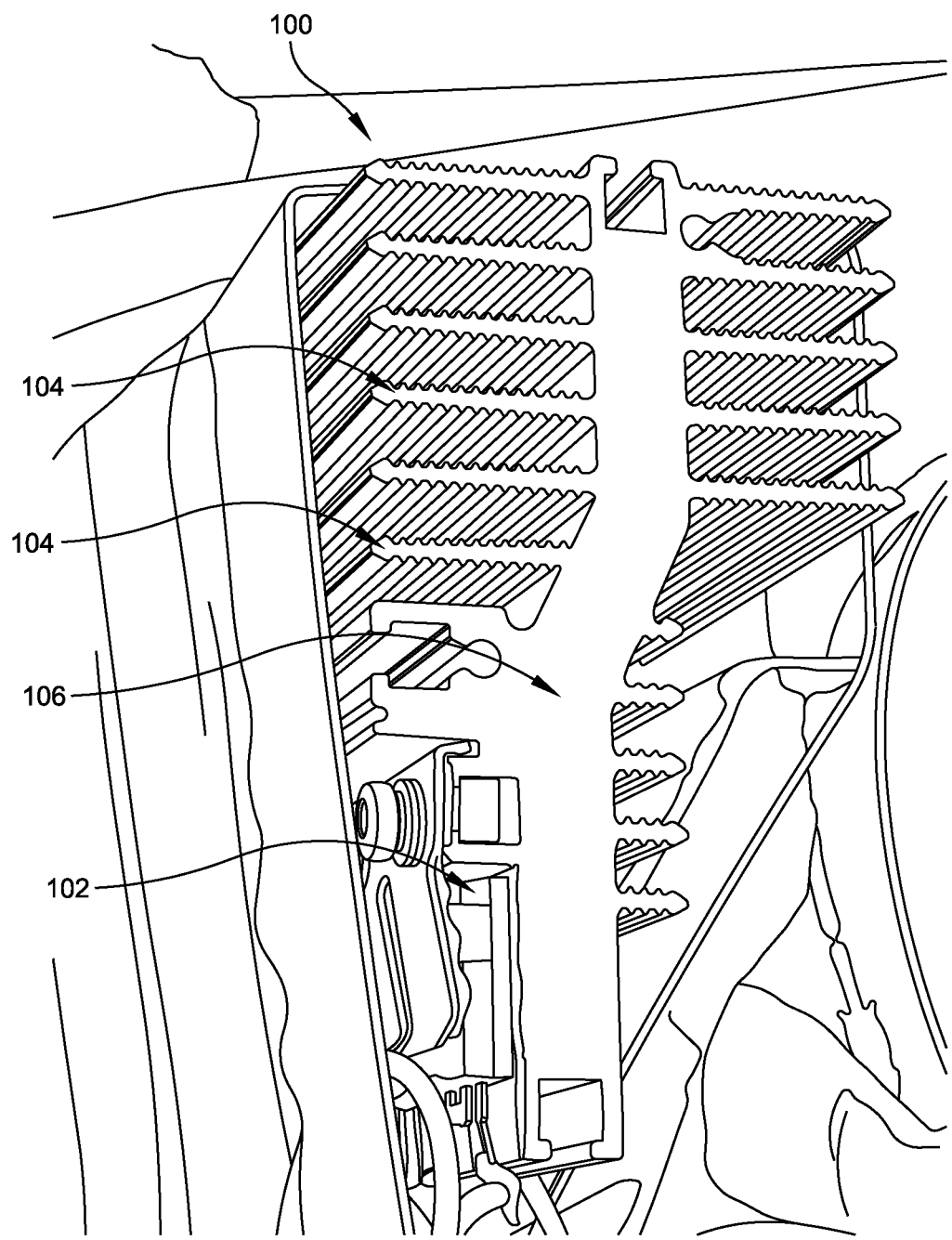
FIG. 1 is a perspective view of one example of a typical heat sink, according to aspects of the prior art.

As discussed above, conventional heat sinks suffer from several disadvantages, such as being increasingly large, heavy and costly. Accordingly, there is a need for a more efficient device, system and method of heat dissipation that would be lighter and easier to construct. Aspects and embodiments are directed to a device and method of heat dissipation that overcome the limitations and drawbacks of conventional solutions, while providing a solution that is functionally uncomplicated and easy to implement. As used herein, the term "heat-generating component" may refer to any electronic components or a group of components that generate heat, for example semiconductor devices, such as bipolar junction transistors, MOS-FETs, diodes or IGBTs.

According to one embodiment, a heat dissipating device is attached to heat-generating component or components. The heat dissipating device includes a base plate and helically-shaped air tubes. In one embodiment, the base plate is attached to the heat-generating component so that heat energy is conducted through the air tubes to the surrounding environment. Helically-shaped air channels may be formed within the shape of the air tubes. The path of heated air flowing through these air channels may be altered to a helically-directed flow-path that stirs a micro layer of stagnant air formed on the immediate surface of the air tubes thereby increasing the speed of air flow and increasing heat dissipation through the heat dissipation device.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 2:
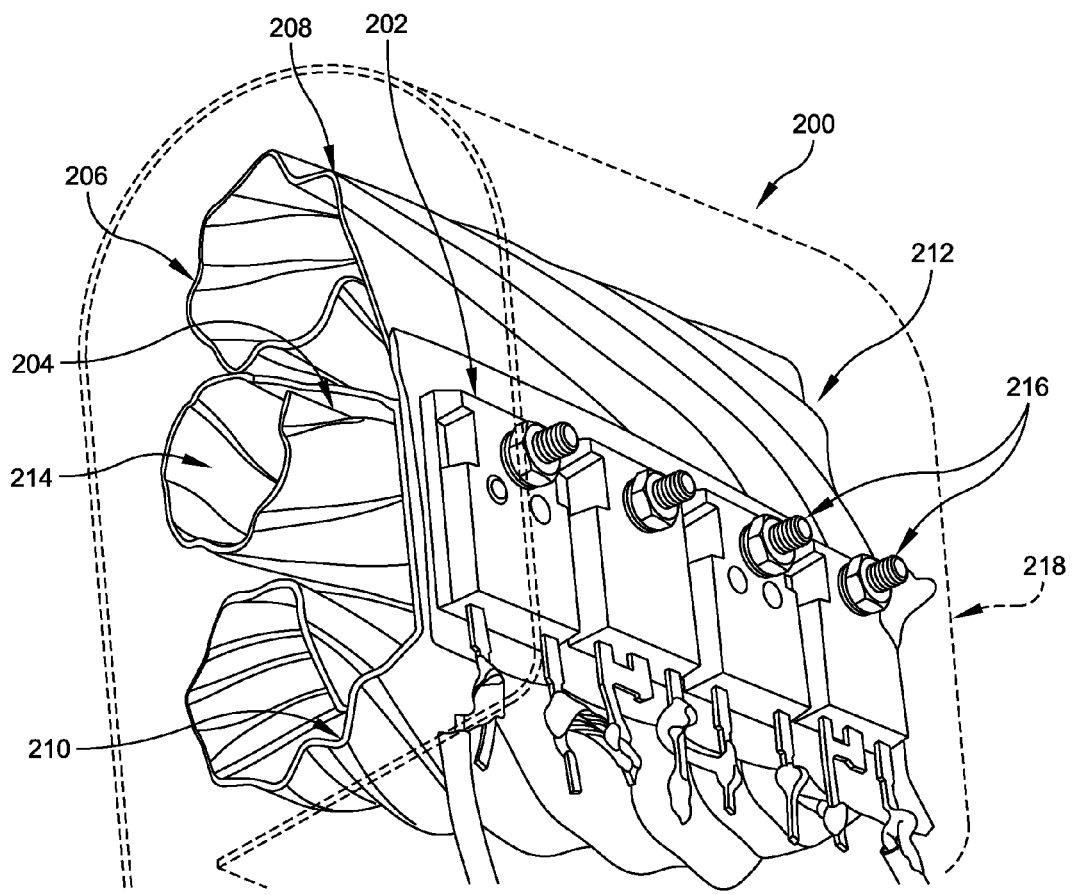
FIG. 2 is a perspective view of one example of a heat dissipation device, according to aspects of the present disclosure.

Referring to FIG. 2, there is illustrated one example of heat dissipation device 200, which is capable of removing heat from a heat-generating component 202, such as a semiconductor device. As shown, there are four heat-generating components 202. However, it should be appreciated that any number of components may be provided and the heat dissipation device 200 may be scaled in accordance with the principles taught herein to remove heat from the heat-generating components 202. In the illustrated example, the heat dissipation device includes a base plate 204 that is attached to heat-generating component 202. The heat dissipation device 200 further includes several air tubes 206, which are secured to one or more walls 208. As shown, the wall 208 is secured to the base plate 204, and in certain embodiments may be formed from the material forming the tube 206. In one embodiment, each air tube 206 has a helix shape formed by one or more air channels 210 that extend along a part of the length or the entire length of the air tube 206.

In one example, each air tube 206 is formed by rolling a rectangular sheet into a cylindrical tube around a longitudinal axis so that the air tube 206 has a predetermined diameter. Each tube has an inlet 212 and an outlet 214 formed on opposite sides of the tube. The sheet may also be formed with spaced-apart grooves on the surface of the sheet. The grooves may be stretch diagonally from one side of the sheet to the other and may contain one or more curvatures along the length of the grooves. In one example, when the sheet and the grooves may be curved around the longitudinal axis, the grooves form the helically-shaped air channels 210 provided on the air tube 206. The grooves may be raised and form a continuous a triangular shape along the length of the grooves. However, any shape of the grooves may be used to form the helically-shaped air channels 210. The sheet and the channels may be milled, die-cast, pressed, rolled or extruded. In a certain embodiment, the sheet may be fabricated from any suitable metal, such as aluminum.

As shown in FIG. 2, there are three air tubes 206, each with substantially equal diameters. However, the number and the diameter of the air tubes 206 may depend on the particular cooling solution, determined by the heat produced by the heat-generating component 202. The diameter of each air tube 206 may be the same for each air tube 206 or it may vary from tube to tube. The air tubes 206 may be disposed close together, with minimal space between each of the air tubes 206. In another example, the air tubes 206 may be spaced apart from each other forming spaces between each air tube.

As discussed above, the side of the sheet opposing the air tube 206 may form the wall or walls 208 that longitudinally extend through a part of the length or the entire length of the air tube 206 and attach to the base plate 204. The walls 208 may be flat on the side opposing the air tubes 206 and may be joined together to form the base plate 204. Alternatively, the base plate 204 may be a separate sheet of material. The walls 208 of the air tubes 206 may then connect to the detached plate. The walls 208 may be straight or may be curved inward or outward toward the center of the device 200. In another example, the air tubes 206 attach directly to the base plate 204 without the use of walls 208.

In one example, when the rectangular sheet is rolled around the longitudinal axis, the edge of the sheet is linked to the walls 208. Alternatively, the air tubes 206 may be partially open, creating a slit along the length of the air tube 206, between the edge of the sheet and the walls 208.

The base plate 204 and the air tubes 206 may be composed of aluminum, copper, alloys thereof or any other material that has the suitable thermal conductively and weight. The base plate 204 and the air tubes 206 can be made of different materials. For example base plate 204 can be copper or ceramics and the air tubes 206 can be aluminum and may be bonded together.

Before heat is dissipated through the air tubes 206 to the surrounding environment, the heat generated may be conducted from the heat-generating component through the base plate 204. The base plate 204 of the heat dissipation device 200 may be mounted to the component 202 by mounting screws 216. However, the base plate 204 may be mounted to the component 202 in any way appropriate to the type of component used, as would be understood by those skilled in the art, given the benefit of this disclosure.

Because air has a higher thermal resistance, it may be desirable to reduce any air gaps between the heat dissipation device 200 and the heat-generating component 202. In one example, a thermal interface material may be disposed between the base plate 204 and the heat-generating component 202 to help facilitate heat dissipation or to achieve electrical insulation. The thermal interface material functions to provide a minimal thermal resistance path or to achieve electrical insulation from the component 202 to the heat dissipation device 200. The material may be grease, gel, thermally conductive adhesive, thermal pads or tape. However, any typical thermal interface material that has a very low thermal resistance may be used, as would be understood by those skilled in the art, given the benefit of this disclosure.

In one example, each heat-generating component 202 generates heat energy, which is conducted through the base plate 204 and the air tubes 206 of the device 200. This heat energy may then be dissipated from the air tubes 206 to the surrounding environment by air flowing though the air tubes 206. This transfer of air through the device 200 may form a path or passage of air. While moving through the air tubes 206, the heated air may form multiple micro layers corresponding to air flowing at different speeds. Because of the principles of heat convection, the micro layer formed on the immediate surface of the air tubes 206 may have the lowest speed of air flow. This micro layer may become stagnant if the air flow continues in the same straight flow-path. Stagnant air may decrease the overall heat transfer and dissipation of the heat dissipation device 200. In one example, the helically-shaped air channels 210 direct heated air from the straight flow-path to a helical flow-path. The helically directed flow-path stirs the micro layer of stagnant air increases the speed of air flow thus increasing heat dissipation through the heat dissipation device 200.

In another embodiment, the heat dissipation device 200 may be part of a heat dissipating system. The system may contain other components that facilitate the dissipation of heat. In one example, a fan is provided. The fan may assist to move the air from the inlet 212 of the air tube to the outlet 214 of the air tube to promote heat dissipation from air tubes 206. Any type and size of fan that is compatible with the heat dissipation device 200 may be used, as would be understood by those skilled in the art, given the benefit of this disclosure. The heat dissipation device 200 may also contain a housing 218 that encloses the heat dissipating device and the heat-generating component 202 around the length of the device. The housing 218 may be open on the sides containing the air tube inlets and outlets. Heated air may flow between the outer surface of the air tubes 206 and within the housing 218 and dissipate to the surrounding environment.

Figure 3:
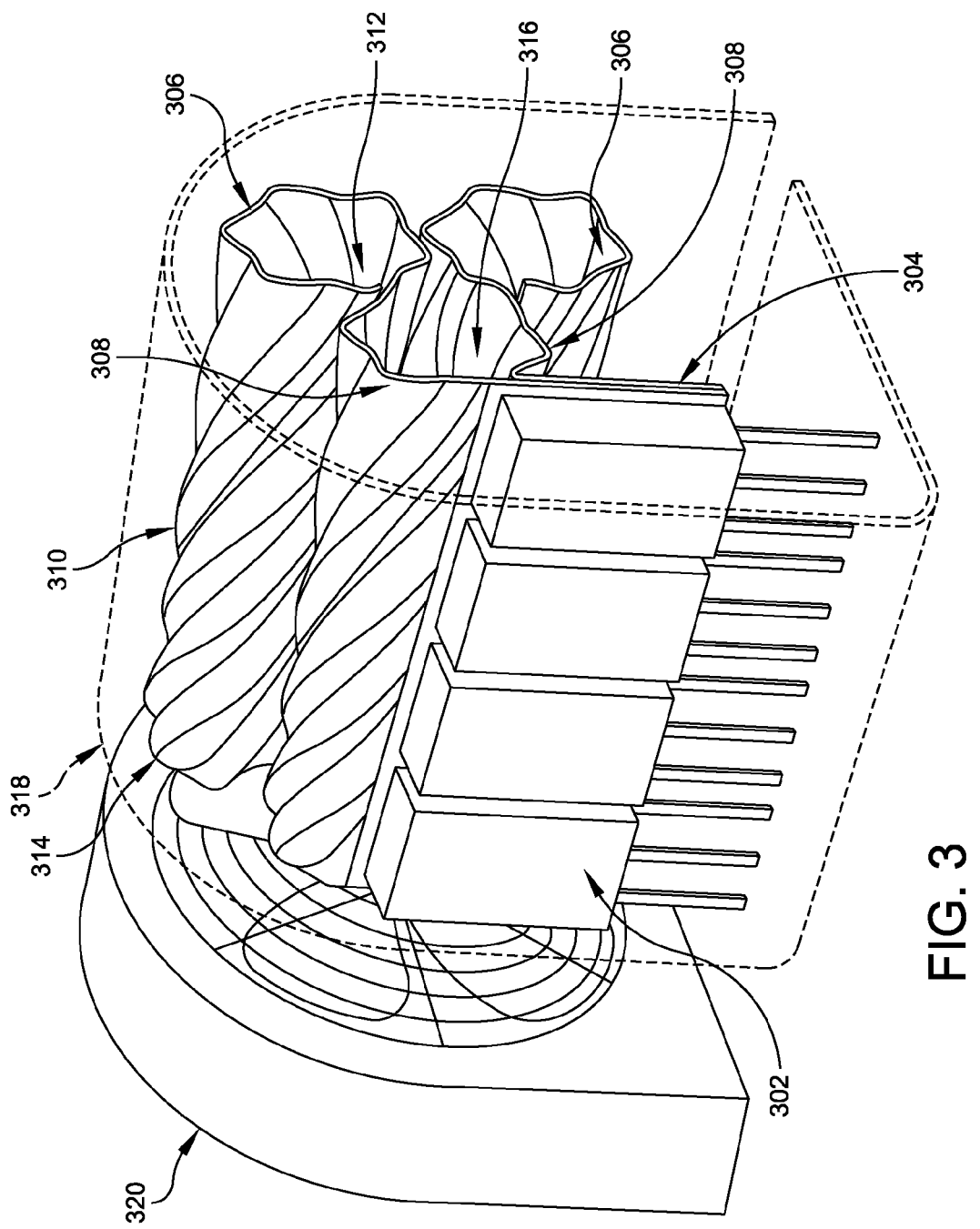
FIG. 3 is a perspective view of another example of a heat dissipation device, according to aspects of the present disclosure.

Referring to FIG. 3, there is illustrated a perspective view of another embodiment of a heat dissipation device 300. In the illustrated example, the heat dissipation device includes a base plate 304 that is attached to heat-generating components 302. As shown, the heat dissipation device 300 includes two air tubes 306, which are secured to one or more walls 308. As with heat dissipation device 200, any number of air tubes 306 may be used for heat dissipation device 300. In one example, each air tube 306 is formed by rolling a rectangular sheet into a cylindrical tube around a longitudinal axis so that the air tube 306 has a predetermined diameter. Each tube may have an inlet 312 and an outlet 314 formed on opposite sides of the tube. The sheet may contain spaced grooves formed on the surface of the sheet.

As shown, the wall 308 is secured to the base plate 304, and in certain embodiments may be formed from the sheet forming the air tube 306. The walls 308 may be flat on the side opposing the air tubes 306 and may be joined together to form the base plate 304. Alternatively, the base plate 304 may be a detached plate. The walls 308 of the air tubes 306 may then connect to the detached plate. The walls 308 may be straight or may be curved inward or outward toward the center of the device 300. In another example, the air tubes 306 attach directly to the base plate 304 without the use of walls 308.

In one embodiment, each air tube 306 has a helix shape formed by one or more air channels 310 that extend along the entire length of the air tube 306. Each of the walls 308 may also have one or more air channels 310. The heat dissipation device 300 may also contain a housing 318 that encloses the heat dissipating device 300 and the heat-generating component 302 around the length of the device. The housing 318 may be open on the sides containing the air tube inlets and outlets.

As illustrated in this example, the walls 308 are curved and extend away from the air tubes 306. The curvature of the walls 308 may form a passage 316, which is disposed proximate to the heat-generating components 302. The passage 316 works in concert with the air tubes 306 to dissipate heated air through the passage 316 and the air tubes 306. Because the walls 308 have grooves, as described above, the passage 316 may have helically-shaped channels 310 formed within the walls of the passage 316. The helically-shaped channels 310 stir the micro layer of air formed on the immediate surface of the passage 316 as well as the air tubes 306.

Still referring to FIG. 3, a fan 320 is provided as part of the heat dissipating system 300. The fan 320 may assist to draw air through the air tubes 306 from the inlet 312 of the air tube to the outlet 314 of the air tube to promote heat dissipation from the air tubes. Any type and size of fan that is compatible with the heat dissipation device 300 may be used, as would be understood by those skilled in the art, given the benefit of this disclosure.

Figure 4:
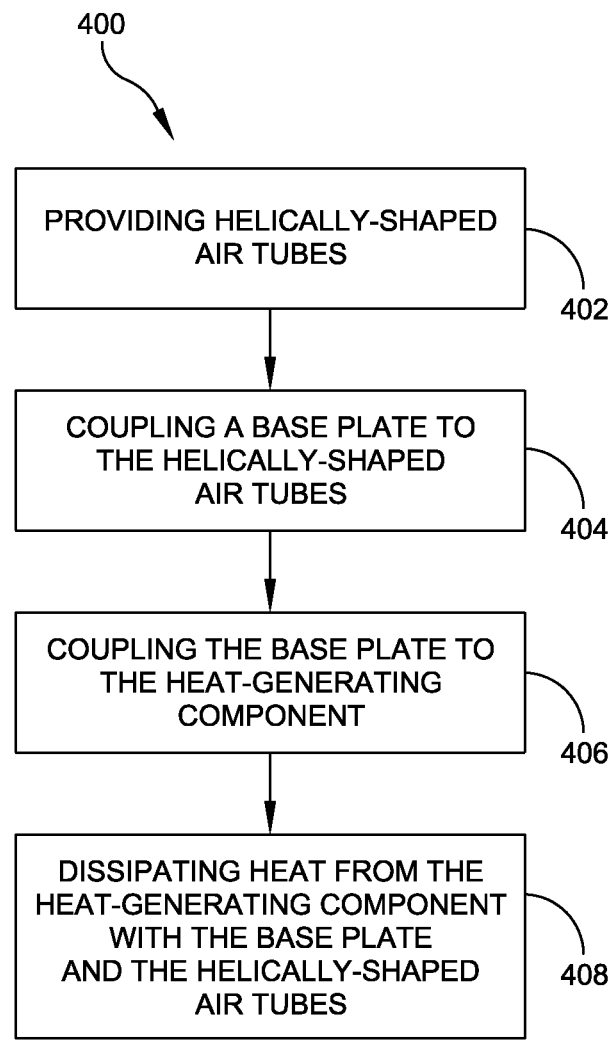
FIG. 4 is a flow diagram of one example of a method of dissipating heat from a heat-generating component, according to aspects of the present disclosure.

A method 400 of dissipating heat from a heat-generating component, according to one embodiment, is now described with reference to FIG. 4. The method includes providing helically-shaped air tubes (step 402), coupling a base plate to the helically-shaped air tubes (step 404), coupling the base plate to the heat-generating component (step 406) and dissipating heat from the heat-generating component with the base plate and the at least one helically-shaped air tube (step 408). In some embodiments, the air tubes may be secured directly to the heat-generating component.

The method may include forming one or more air channels within the air tube as a helix. As described above, air flowing through these air channels may be directed from the straight flow-path to a helically directed flow-path by the air channels. Thus, the micro layer of air formed on an inner surface of the one or more helically-shaped air tubes is stirred to enhance heat removal from the heat dissipating component.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

The invention claimed is:

1. A heat dissipation device for a heat-generating component, the heat dissipation device comprising:

a first sheet formed with spaced-apart grooves on a surface of the first sheet, the grooves being stretched diagonally from one side of the first sheet to the other and containing one or more curvatures along the length of the grooves, the grooves forming helically-shaped air channels, the first sheet integrally forming a first base plate secured to the heat-generating component, a first helically-shaped air tube, and a first wall positioned between the first base plate and the first helically-shaped air tube; and a second sheet formed with spaced-apart grooves on a surface of the second sheet, the grooves being stretched diagonally from one side of the second sheet to the other and containing one or more curvatures along the length of the grooves, the grooves forming helically-shaped air channels, the second sheet integrally forming a second base plate secured to the heat-generating component, a second helically-shaped air tube, and a second wall positioned between the second base plate and the second helically-shaped air tube, wherein the first wall and the second wall form a passage that defines a third helically-shaped air tube, and wherein the first, second and third air tubes have a length with the helix shape being formed by the air channels that extend along the length of the air tubes, the first, second and third air tubes being thermally coupled to the heat-generating component by the first and second base plates to dissipate heat from the heat-generating component.

2. The heat dissipation device of claim 1, wherein the third helically-shaped tube is disposed proximate to the heat-generating component.

3. The heat dissipation device of claim 1, wherein each of the helically-shaped air tubes include an inlet provided on one end of the at least one air tube and an outlet provided on an opposite end of the air tube, wherein heated air produced by the heat-generating component flows from the inlet to the outlet.

4. The heat dissipation device of claim 3, further comprising a fan configured to propel air from the inlets to the outlets of the helically-shaped air tubes.

5. The heat dissipation device of claim 1, wherein each of the helically-shaped air tube includes an inner surface, wherein heated air produced by the heat-generating component flows along the inner surface.

6. The heat dissipation device of claim 1, further comprising a housing configured to enclose the heat dissipation device.

\* \* \* \* \*